United States Patent
Park et al.

(10) Patent No.: US 9,990,986 B1
(45) Date of Patent: Jun. 5, 2018

(54) STATIC RANDOM ACCESS MEMORY DEVICE HAVING UNIFORM WRITE CHARACTERISTICS

(71) Applicant: SAMSUNG ELECTRONICS CO., LTD., Suwon-si, Gyeonggi-do (KR)

(72) Inventors: Ingyu Park, Seoul (KR); Inhak Lee, Daegu (KR); Chanho Lee, Hwaseong-si (KR); Jaeseung Choi, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/706,859

(22) Filed: Sep. 18, 2017

(30) Foreign Application Priority Data

Dec. 6, 2016 (KR) .................. 10-2016-0165212

(51) Int. Cl.

| G11C 11/00 | (2006.01) |
|---|---|
| G11C 11/419 | (2006.01) |
| G11C 11/412 | (2006.01) |
| H01L 27/11 | (2006.01) |
| G11C 5/06 | (2006.01) |
| G11C 5/14 | (2006.01) |

(52) U.S. Cl.
CPC .......... *G11C 11/419* (2013.01); *G11C 11/412* (2013.01); *G11C 5/063* (2013.01); *G11C 5/147* (2013.01); *H01L 27/1104* (2013.01)

(58) Field of Classification Search
CPC ..... G11C 11/419; G11C 11/412; G11C 5/063; G11C 5/147
USPC ......................................... 365/154
See application file for complete search history.

(56) References Cited

U.S. PATENT DOCUMENTS

| 7,113,421 | B2 | 9/2006 | Maeda et al. |
| 7,379,347 | B1 | 5/2008 | Nautiyal |
| 7,733,687 | B2 | 6/2010 | Kengeri et al. |
| 7,852,661 | B2 | 12/2010 | Liu |
| 7,952,911 | B2 | 5/2011 | Lee et al. |
| 8,004,907 | B2 | 8/2011 | Russell et al. |
| 8,773,918 | B2 | 7/2014 | Tanabe |
| 9,042,162 | B2 | 5/2015 | Lee et al. |
| 2001/0006476 | A1* | 7/2001 | Itoh ................. G11C 11/412 365/156 |
| 2005/0212560 | A1* | 9/2005 | Hidaka ............. H03K 19/0016 326/83 |

(Continued)

FOREIGN PATENT DOCUMENTS

| JP | 4553185 | 9/2010 |
| KR | 101168340 | 7/2012 |

*Primary Examiner* — Harry W Byrne
(74) *Attorney, Agent, or Firm* — F. Chau & Associates, LLC

(57) ABSTRACT

A static random access memory device includes a plurality of memory cells arranged in rows and columns, a write driver configured to apply a bit line voltage corresponding to write data to a bit line extending in a column direction of the plurality of memory cells in a write operation, and a sub power line configured to transmit a cell driving voltage to the plurality of memory cells in the write operation and to extend in a direction parallel to the bit line, and includes a first node and a second node. The cell driving voltage is applied to the first node of the sub power line and the first node of the sub power line is aligned with an output node of the write driver in a row direction of the plurality of memory cells.

20 Claims, 12 Drawing Sheets

(56) References Cited

U.S. PATENT DOCUMENTS

| | | | |
|---|---|---|---|
| 2008/0037358 A1* | 2/2008 | Yabuuchi | G11C 5/147 365/230.06 |
| 2011/0235439 A1* | 9/2011 | Itoh | G11C 11/412 365/189.06 |
| 2015/0146476 A1 | 5/2015 | Zhang et al. | |

* cited by examiner

STATIC RANDOM ACCESS MEMORY DEVICE HAVING UNIFORM WRITE CHARACTERISTICS

CROSS-REFERENCE TO RELATED APPLICATION

This U.S. non-provisional patent application claims priority under 35 U.S.C. § 119 to Korean Patent Application No. 10-2016-0165212 filed on Dec. 6, 2016, the disclosure of which is incorporated by reference herein in its entirety.

TECHNICAL FIELD

The present inventive concept relates to semiconductor memory devices, and more particularly, to a static random access memory device having a uniform write characteristic.

DISCUSSION OF THE RELATED ART

A semiconductor memory device may be classified as a SRAM (static random access memory) storing data using a latch or a DRAM (dynamic random access memory) storing data using a capacitor. The SRAM has a lower degree of integration than that of the DRAM, and thus, less data storage capacity than that of the DRAM while occupying the same area as that of the DRAM. However, since a configuration of the SRAM includes a peripheral circuit and the SRAM operates with a relatively high speed, the SRAM may be used as a cache memory.

Further, the SRAM may include Fin Field Effect transistors (FinFET). In addition, a size of a FinFET transistor is discretely controlled according to the number of its Fins constituting a channel. Because of this, a control of a write characteristic of the SRAM is reduced.

SUMMARY

According to an exemplary embodiment of the present inventive concept, a static random access memory device includes a plurality of memory cells arranged in rows and columns, a write driver configured to apply a bit line voltage corresponding to write data to a bit line extending in a column direction of the plurality of memory cells in a write operation, and a sub power line configured to transmit a cell driving voltage to the plurality of memory cells in the write operation and to extend in a direction parallel to the bit line, and includes a first node and a second node. The cell driving voltage is applied to the first node of the sub power line and the first node of the sub power line is aligned with an output node of the write driver in a row direction of the plurality of memory cells.

According to an exemplary embodiment of the present inventive concept, a static random access memory device includes a cell array comprising a plurality of bit cells, a plurality of bit lines extending in a column direction, a plurality of sub power lines extending in a direction parallel to the bit lines, a write driver writing data in a selected bit cell through the plurality of bit lines, a main power line providing a cell driving voltage to the selected bit cell, and an extension power line connecting the main power line and the sub power line. Each of the plurality of sub power lines is formed with a conducive line on the same semiconductor layer as the plurality of bit lines. The extension power line, in a write operation, is formed to have a length having a distribution resistance for providing a ratio of a pull-up current to a pull-down current of the selected bit cell as a predetermined value.

According to an exemplary embodiment of the present inventive concept, a static random access memory device includes a plurality of memory cells arranged in rows and columns, a write driver configured to apply a bit line voltage to an end of a bit line in a column direction of the plurality of memory cells, a sub power line configured to transmit a cell driving voltage to the plurality of memory cells in a direction parallel to the bit line, wherein the sub power line has the same length and width as the bit line, a first extension power line connected to an extension conductive line, and a second extension power line connected to the extension conductive line and the sub power line.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Exemplary embodiments of the present invention will be described more fully hereinafter with reference to the accompanying drawings.

Figure 1:
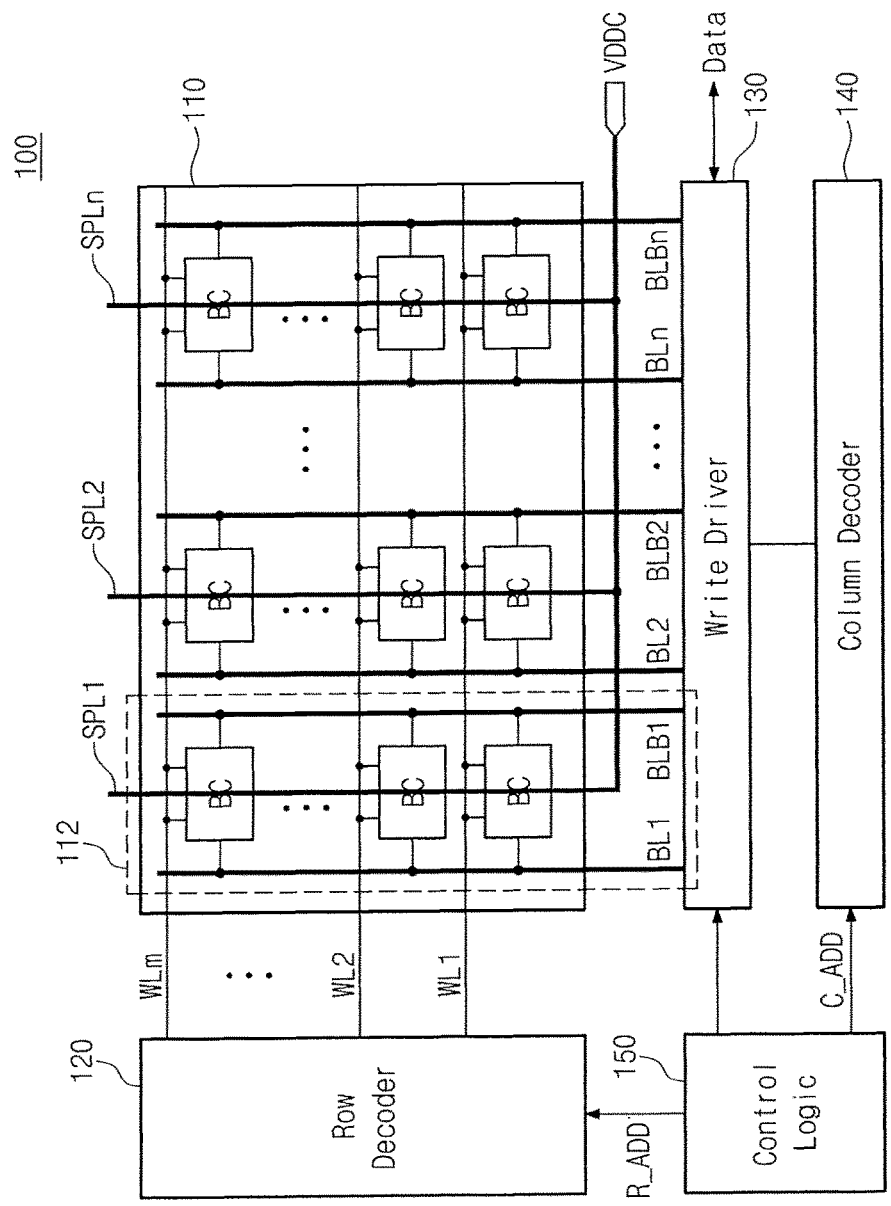
FIG. 1 is a block diagram of a semiconductor memory device according to an exemplary embodiment of the present inventive concept.

FIG. 1 is a block diagram of a semiconductor memory device according to an exemplary embodiment of the present inventive concept. Referring to FIG. 1, the semiconductor memory device 100 may include a cell array 110, a row decoder 120, a write driver 130, a column decoder 140, and control logic 150.

The cell array 110 may include a plurality of word lines (WL1 to WLm; m is an integer equal to or greater than 2), a plurality of bit lines (BL1 to BLn; n is an integer equal to or greater than 2), and a plurality of bit cells BC (or memory cells) for storing data. Each of the plurality of bit lines (BL1 to BLn) may be provided as a differential bit line including a bit line (BLi, 1≤i≤n) and a complementary bit line (BLBi, 1≤i≤n). A pair of bit lines includes a bit line (BLi) and a complementary bit line (BLBi), and the pair of bit lines (BLi and BLBi) may write data, which is provided from the write driver 130, in a bit cell BC that crosses one of the plurality of word lines (WLj, 1≤j≤m).

The bit cells BC are connected to sub power lines (SPL1 to SPLn; n is an integer equal to or greater than 2) extending in a direction parallel to the bit lines (BLi, BLBi). Drive voltages may be applied to the bit cells BC through the sub power lines (SPLi, 1≤i≤n). The pair of bit lines (BLi, BLBi) and the sub power lines SPLi are provided in the same semiconductor layer and may be a conductive line having substantially the same conductivity, length, and width. A cell driving voltage VDDC may be provided to the sub power lines SPLi from an external device. In addition, a bit line voltage is provided to the bit lines (BLi, BLBi) from the write driver 130.

The row decoder 120 may decode a row address R_ADD and may select a word line from among the plurality of word lines (WL1 to WLm) according to a decoding result of the row address R_ADD. In a write operation, the row decoder 120 supplies a word line voltage, which is a high level 'H' voltage, to one word line selected by the row address R_ADD. The row decoder 120 supplies a word line voltage, which is a low level 'L' voltage, to word lines unselected by the row address R_ADD.

In a write operation, the write driver 130 writes inputted data into selected bit cells BC of the cell array 110 according to a control signal outputted from the control logic 150 to the write driver 130. The write driver 130 may write data into a selected bit cell BC using the pair of bit lines (BLi, BLBi).

The column decoder 140 decodes a column address (C_ADD) and may select at least one bit line from among the pairs of bit lines (BLi, BLBi) according to a decoding result of the column address C_ADD. The decoding result may be outputted to the write driver 130. Further, a logical value provided by the write driver 130 may be written into a bit cell BC selected by the column decoder 140.

The control logic 150 can control an operation of the write driver 130 based on a command, an address, a control signal, etc. received from the outside (e.g., an external device). In a write operation, the control logic 150 may write data in a selected bit cell by controlling various peripheral circuits, including the write driver 130.

In the semiconductor memory device 100, the pair of bit lines (BLi, BLBi) receiving the bit line voltage and the sub power line SPLi receiving the cell driving voltage VDDC may each be a conductive line having the same electrical characteristic. In addition, the cell driving voltage VDDC may be provided in the same direction as that of the bit line voltage provided from the write driver 130. Thus, if a bit line voltage drops according to a distribution resistance of the pair of bit lines (BLi, BLBi), the cell driving voltage VDDC may also drop according to a distribution resistance of the sub power line SPLi. Thus, a bit cell design that is based on a difference between the bit line voltage and the cell driving voltage VDDC may have a wide range of possibilities.

Figure 2:
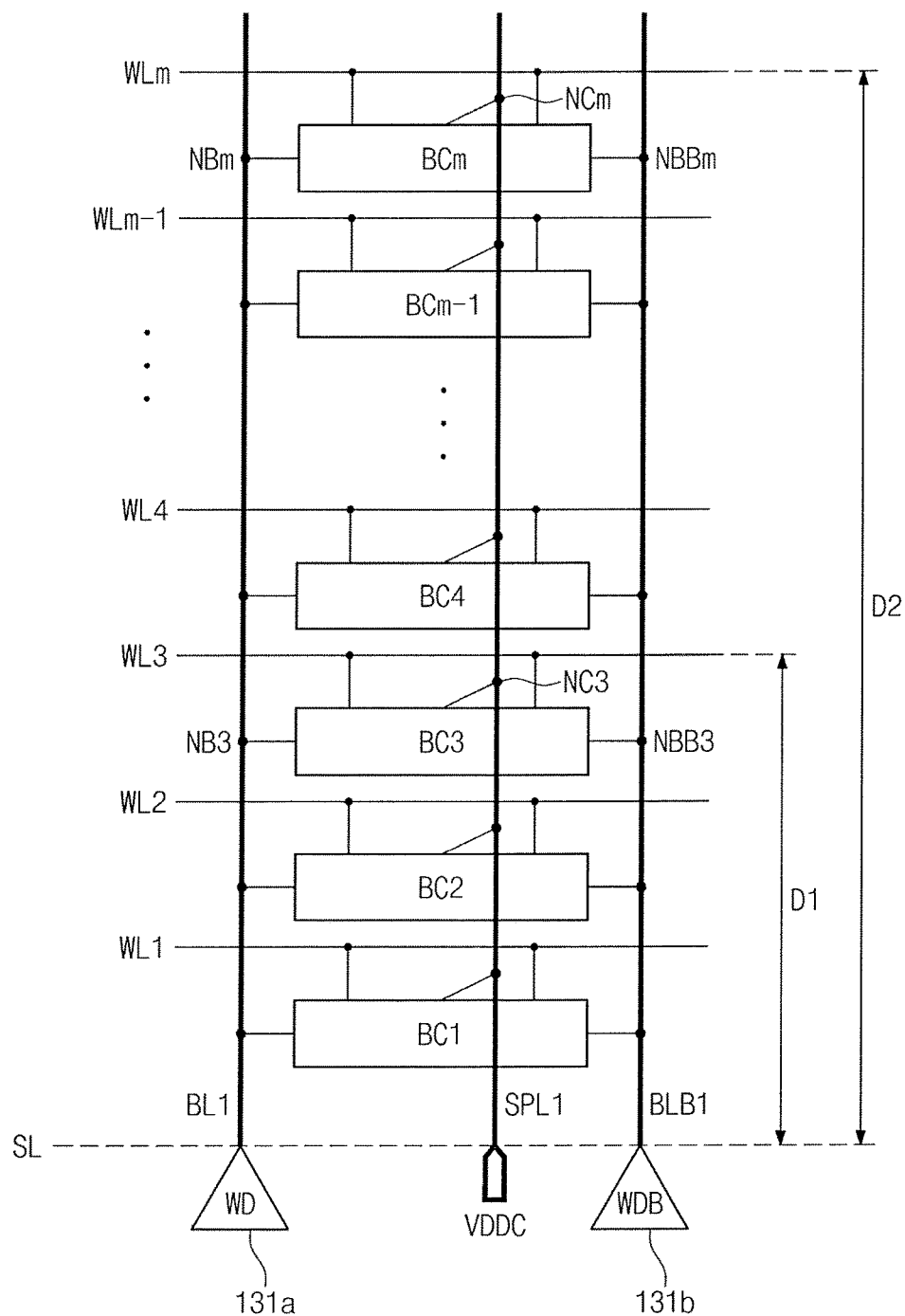
FIG. 2 is a view illustrating a part of a cell array in the semiconductor memory device illustrated in FIG. 1.

FIG. 2 is a view illustrating a part of a cell array 112 in a semiconductor memory device 100 illustrated in FIG. 1. Referring to FIG. 2, bit cells (BC1 to BCm) connected to the pair of bit lines (BL1, BLB1) of FIG. 1 are illustrated.

The bit line BL1 connected to a write driver 131a and the complementary bit line BLB1 connected to a write driver 131b may be formed parallel to each other along a direction from a start line SL. For example, the direction of the bit line BL1 and the complementary bit line BLB1 may be substantially perpendicular to that of the start line SL and toward the bit cells BC. As an additional example, the write drivers 131a and 131b may each include an output node connected to their respective bit line (BL1, BLB1) and that is on the start line SL. The pair of bit lines (BL1, BLB1) may be formed using a metal pattern for forming bit lines (BL1, BLB1), which may be on the same semiconductor layer as each other. A complementary bit line voltage provided from the write driver (131b) may be transmitted to a latch of a bit cell BC connected to a word line among the plurality of word lines (WL1 to WLm). For example, in the case where the word line WL3 is activated, data may be written to a bit cell BC3 through nodes (NB3, NBB3) connected to the bit lines (BL1, BLB1). Similarly, in the case where the word line WLm is activated, data may be written into a bit cell BCm through nodes (NBm, NBBm) connected to the bit lines (BL1, BLB1).

In addition, when the cell driving voltage VDDC, which will be used as a drive power supply of the bit cells (BC1 to BCm), is transmitted to each of the bit cells (BC1 to BCm) through the sub power line SPL1. The sub power line SPL1 may extend parallel to the pair of bit lines (BL1, BLB1) along a direction from the start line SL toward the bit cells. For example, a node of the sub power line SPL1 may be on the start line SL and may be aligned with the output nodes of the write drivers 131a and 131b.

As a distance between the start line SL and the bit cells (BC1 to BCm) increases, a voltage drop at the pair of bit lines (BL1, BLB1) extending from the start line SL to the bit cells (BC1 to BCm) increases. This voltage drop is caused by a distribution resistance distributed in the pair of bit lines (BL1, BLB1). Similarly, as a distance from the start line SL increases, a voltage drop of the cell driving voltage VDDC due to a distribution resistance of the sub power line SPL1 increases. However, the pair of bit lines (BL1, BLB1) and the sub power line SPL1, which both have the same start line SL, direction, and characteristic, may have the same tendencies regarding a voltage drop and an increase of a distribution resistance.

For example, a level difference between a bit line voltage and a cell driving voltage VDDC that are applied to the bit cell BC3 spaced a distance D1 apart from the start line SL might not be greatly different from a level difference between a bit line voltage and a cell driving voltage VDDC at the start line SL. For example, a difference between a voltage of the node NB3 of the bit line BL1 and a voltage of a node NC3 of the sub power line SPL1 might not be greatly different from a difference between a voltage of a terminal node NBm of the bit line BL1 and a voltage of a terminal node NCm of the sub power line SPL1.

Reliability of data stored in the bit cells (BC1 to BCm) may be increased by providing the bit line BL1 and the sub power line SPL1 in the same direction as each other.

Figure 3A:
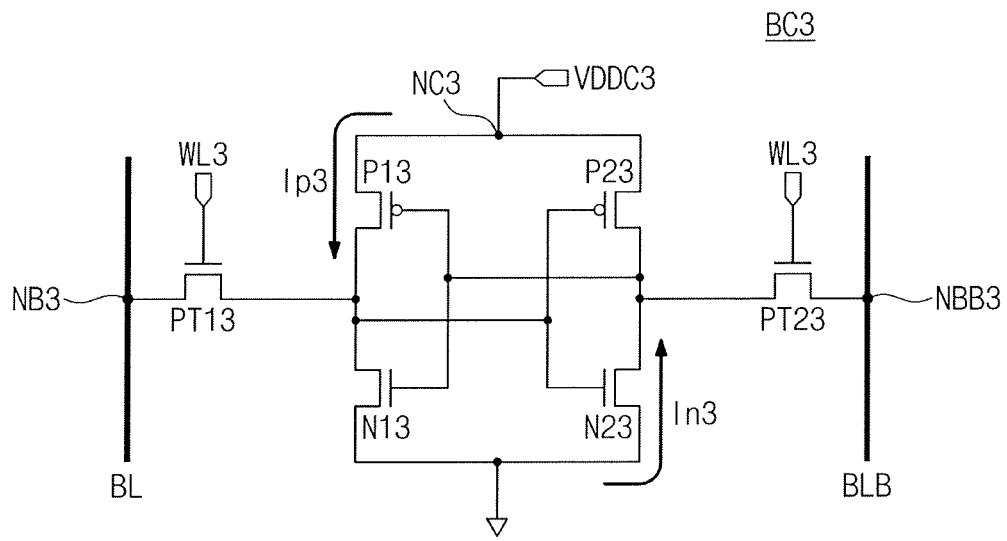
FIGS. 3A and 3B are circuit diagrams illustrating bit cells at different locations of FIG. 2, respectively.
Figure 3B:
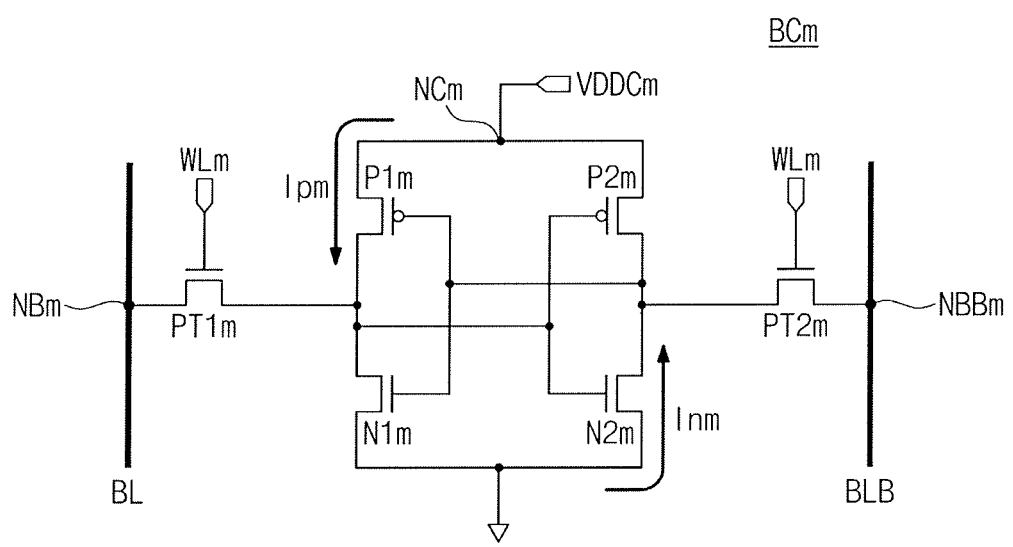

FIGS. 3A and 3B are circuit diagrams illustrating bit cells BC3 and BCm of different locations of FIG. 2, respectively. FIG. 3A illustrates a structure of the bit cell BC3 located a relatively short distance from the start line SL. FIG. 3B illustrates a structure of the bit cell BCm located at a relatively long distance from the start line SL.

Referring to FIG. 3A, the bit cell BC3 may include six transistors. The bit cell BC3 may include a first inverter including a P-type metal-oxide-semiconductor (PMOS) transistor P13 and an N-type metal-oxide-semiconductor (NMOS) transistor N13. The bit cell BC3 may include a second inverter including a PMOS transistor P23 and an NMOS transistor N23. The first and second inverters are cross-coupled to each other and data is written and maintained by a positive feedback. A cell driving voltage VDDC3 is provided to pull-up transistors (e.g., P13, P23) of the first and second inverters, respectively. The cell driving voltage VDDC3 may be a voltage lower than the cell driving voltage VDDC initially provided at the start line SL. The bit cell BC3 is connected to the bit line (BL, BLB) by pass transistors (PT13, PT23). Gates of the pass transistors (PT13, PT23) are connected to a word line WL3. If a predetermined voltage is applied to the word line WL3, the pass transistors (PT13, PT23) are turned on and the bit cell BC3 including the first and second inverters is connected to the pair of bit lines (BL, BLB). In addition, a pull-up current (Ip3, Ipm) and a pull-down current (In3, Inm) may be provided to the bit cell BC3.

Referring to FIG. 3B, the bit cell BCm has the same structure as the bit cell BC3 of FIG. 3A. Thus, a description of configuration and structure of the bit cell BCm may be omitted. For example, the PMOS transistors (P13, P23), NMOS transistors (N13, N23), and the pass transistors (PT13, PT23) may correspond to PMOS transistors (P1m, P2m), NMOS transistors (N1m, N2m), and the pass transistors (PT1m, PT2m). However, a cell driving voltage VDDCm of the bit cell BCm and a bit line voltage received by the nodes (NBm, NBBm) are lower than the cell driving voltage VDDC and the bit line voltage that are initially provided. However, if the cell driving voltage VDDCm and the bit line voltage drop at the same rate, a deviation of write performance of the bit cell BC3 and the bit cell BCm may be decreased.

Figure 4:
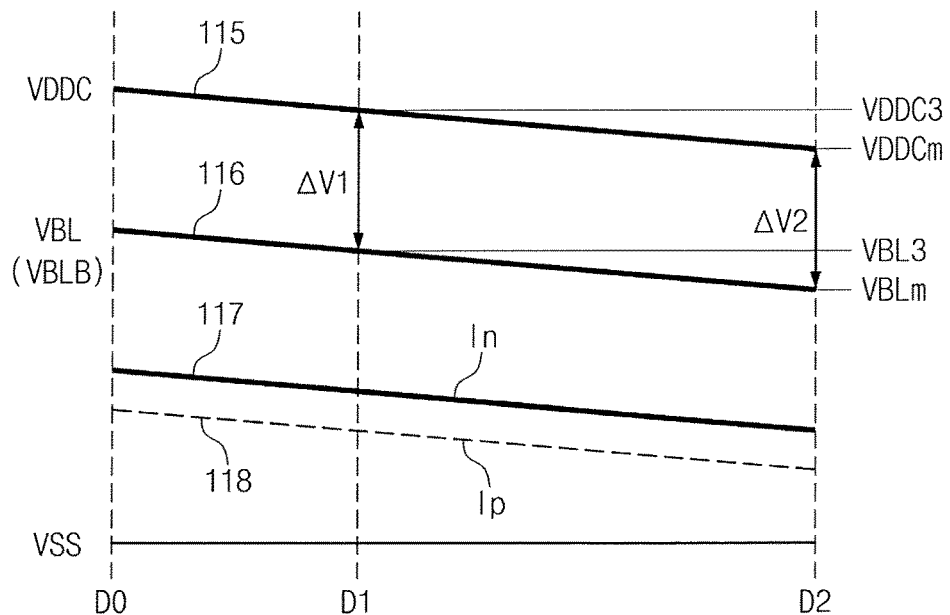
FIG. 4 is a graph illustrating a cell driving voltage provided through a power line, and a bit line voltage based on a location on a cell array.

FIG. 4 is a graph illustrating a cell driving voltage VDDC provided through a power line and a bit line voltage based on a location on a cell array. Referring to FIG. 4, according to the sub power line transmitting the cell driving voltage VDDC, a change characteristic of the bit line voltage VBL in the cell array is the same as that of the cell driving voltage VDDC in the cell array. The change characteristic of the cell driving voltage VDDC is illustrated by a curve 115 and the change characteristic of the bit line voltage VBL is illustrated by a curve 116. In addition, since the cell driving voltage VDDC is provided to the sub power line in the same direction as the bit line voltage VBL, a pull-up current (Ip) and a pull-down current (In) that occur in a write operation of the bit cells may increase or decrease in the same direction. A change of the pull-down current is illustrated by a curve 117 and a change of the pull-up current is illustrated by a curve 118.

First, let's assume that voltages at start points D0 of the bit line BL and the sub power line are an initial bit line voltage VBL and an initial cell driving voltage VDDC respectively. Further, voltages received at a distance D1 from the start points D0 may be a bit line voltage VBL3 and a cell driving voltage VDDC3 due to the effect of a distribution resistance. At this time, a level difference as much as a voltage difference ΔV1 may occur between the cell driving voltage VDDC3 and the bit line voltage VBL3.

Voltages at a distance D2 from the start points D0 may be a bit line voltage VBLm and a cell driving voltage VDDCm. At this time, a level difference as much as a voltage difference ΔV2 may occur between the cell driving voltage VDDCm and the bit line voltage VBLm. A difference between the voltage difference ΔV1 and the voltage difference ΔV2 might not be relatively large.

As moved away from the start points D0 (e.g., the start line SL), the pull-up current (Ip) and the pull-down current (In) of the bit cells decrease as illustrated in curves 117 and 118. If the pull-up current (Ip) increases and the pull-down current (In) decreases according to a relative location in the cell array 110, reliability of a data write operation according to a location of cell may be increased.

As described above, the bit line voltage VBL and the cell driving voltage VDDC supplied to the bit cell BC in the cell array 110 through the bit line BL and the sub power line SPL may decrease as the distance from start line SL increases. As a result, the pull-up current (Ip) and the pull-down current (In) may increase or decrease equally depending on a relative location of the bit cell BC in the cell array 110. A voltage difference between the bit line BL and the sub power line SPL was described as an example, but the bit line BL and the sub power line SPL have substantially the same electrical characteristics as each other, which may result in having the same behavior (e.g., tendency) as each other.

Figure 5:
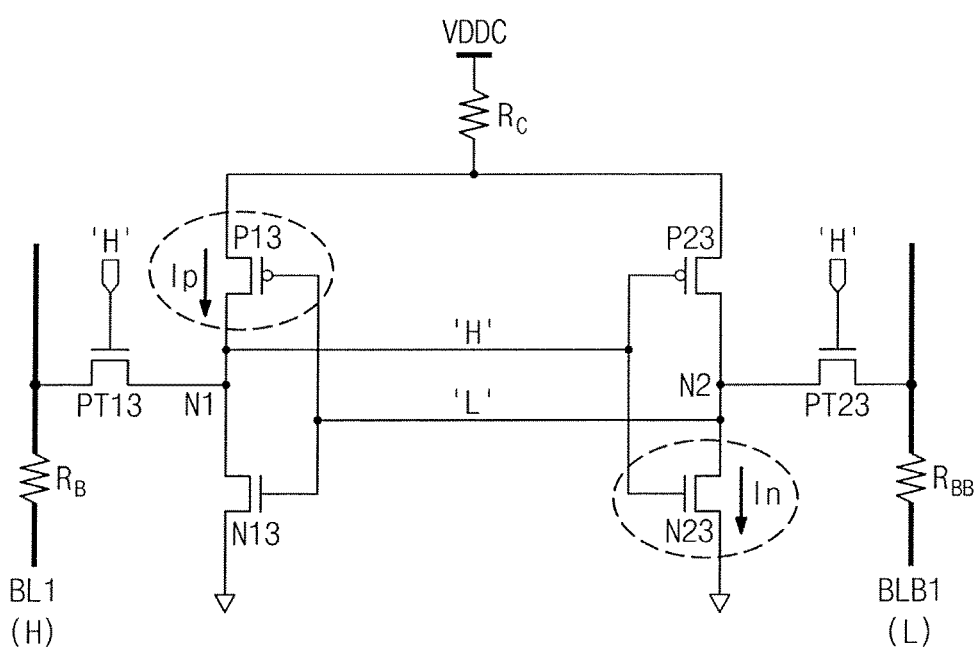
FIG. 5 is a circuit diagram illustrating a write characteristic of a bit cell according to an exemplary embodiment of the present inventive concept.

FIG. 5 is a circuit diagram illustrating a write operation of a bit cell BC according to an exemplary embodiment of the present inventive concept. Referring to FIG. 5, a PMOS current (Ip) (pull-up current) and an NMOS current (In) (pull-down current) that are provided to the bit cells BC may increase or decrease equally according to the bit line voltage and the cell driving voltage. For example, as bit cells BC are located far away from the write driver 130, the PMOS current (Ip) and the NMOS current (In) that flow through the bit cells are reduced at the same time. An electrical characteristic where the PMOS current (Ip) increases and the NMOS current (In) decreases depending on a location of the bit cell may be prevented. A write characteristic of a SRAM cell will be described using the bit cell BC3.

It is assumed that a voltage corresponding to a high level 'H' is provided to a bit line BL1 and a voltage corresponding to a high level 'L' is provided to a complementary bit line BLB1. In this case, as a pair of bit lines (BL, BLB) extends across the cell array 110, a distribution resistance distributed in the pair of bit line (BL, BLB) may be generated. A distribution resistance of the bit line BL1 may be a resistance $R_B$, and a distribution resistance of the complementary bit line BLB1 may be a resistance $R_{BB}$.

Similarly, to provide the cell driving voltage VDDC, the sub power line SPL1 connected to the bit cell BC3 may be connected to sources of the pull-up transistors (P13, P23). A resistance component distributed in the sub power line SPL1 according to a length of the sub power line SPL1 may be a resistance Rc.

According to a method of applying a voltage to the bit line (BL1, BLB1) and the power line, the distribution resistances ($R_B$, $R_{BB}$) of the pair of bit lines (BL1, BLB1) and the distribution resistance Rc of the sub power line SPL1 may increase or decrease equally according to a location of the receiving bit cell BC. For example, the distribution resistances (Rc, $R_B$, $R_{BB}$) increase or decrease equally according to a relative distance from the write driver 130. A write characteristic of bit cells constituting the cell array 110 may be determined by a characteristic where the distribution resistances (Rc, $R_B$, $R_{BB}$) increase or decrease.

In a write operation, the distribution resistances ($R_B$, $R_{BB}$) of the pair of bit lines (BL1, BLB1) determine a level of the pull-down current (In) flowing through the NMOS transistor N23 of the bit cell. The distribution resistance Rc of the sub power line SPL1 determines a level of the pull-up current (Ip) flowing through the PMOS transistor P13 of the bit cell. In the case where the pull-up current (Ip) increases but the pull-down current (In) decreases depending on a location of the bit cell BC (and vice versa), design variations for determining a write characteristic of the bit cell BC may be decreased. However, a characteristic where the pull-up current (Ip) and the pull-down current (In) increase or decrease may be maintained along the same direction according to a direction and an arrangement of the bit line BL and the sub power line SPL. This characteristic means that it is possible to increase a write operation and reliability of data storage without additional configurations of the semiconductor memory device 100.

A value of the distribution resistance Rc of the sub power line SPL1 may be variously adjusted through technologies that will be described later. For example, the distribution resistance Rc of the sub power line SPL1 may be controlled to an optimum value through various conductive patterns (metal line, via, etc.).

Figure 6:
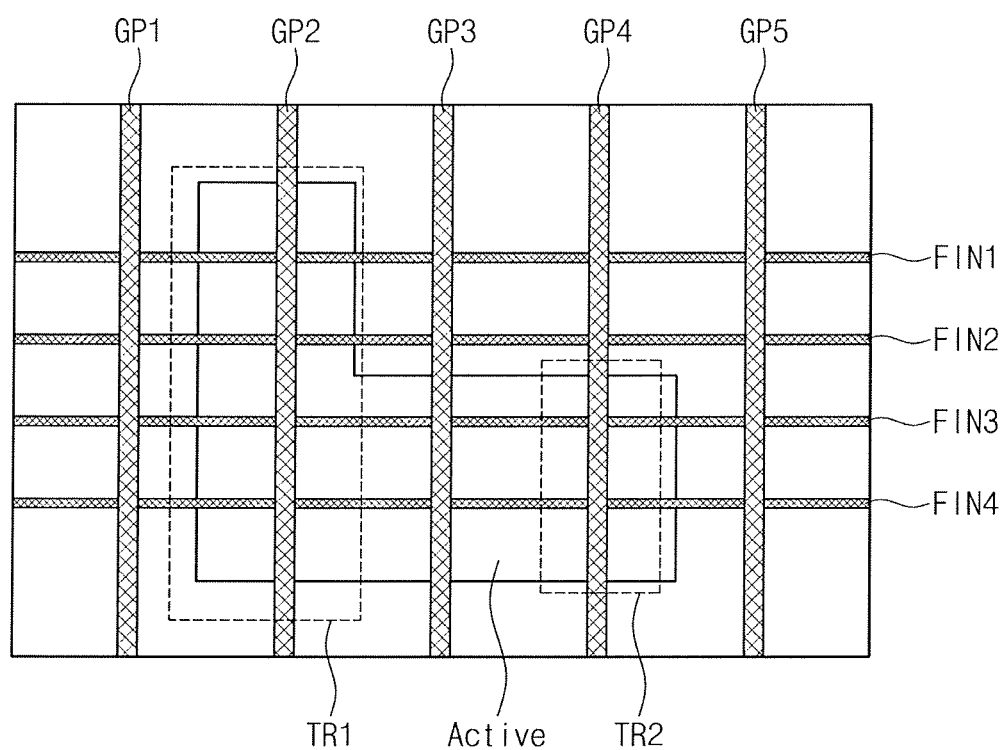
FIG. 6 is a layout drawing illustrating a Fin Field Effect transistor (FinFET) structure.

FIG. 6 is a layout drawing illustrating a Fin Field Effect transistor (FinFET) structure. Referring to FIG. 6, a method of determining a size of the FinFET will be described.

According to a layout illustrated, two transistors (TR1, TR2) having a Fin structure are described as an example. The two transistors (TR1, TR2) may be a PMOS transistor and/or an NMOS transistor. The layout for constituting at least one FinFET may include an active area, a plurality of silicon fins (FIN1, FIN2, FIN3, FIN4) formed thereon, and gate lines (GP1 to GP5). The active area may be formed by injecting dopant into an upper portion of a substrate 113, and the active area may constitute the two transistors (TR1, TR2) by the gate lines (GP2, GP4) formed of poly silicon.

One FinFET of 4-pin structure is formed by the gate line GP2 and four silicon fins (FIN1, FIN2, FIN3, FIN4). In addition, two FinFETs of 2-pin structure may be formed by the gate line GP4 and two silicon fins (FIN3, FIN4).

As described above, allocation of silicon fins to determine a size of a transistor is discrete. For example, in an ideal case, a size of the transistor TR1 having four silicon fins (FIN1, FIN2, FIN3, FIN4) is twice a size of the transistor TR2 having two silicon fins (FIN3, FIN4). For example, the transistor TR1 may provide a channel current twice that of the transistor TR2.

The characteristic described above means that it is difficult to accomplish a write characteristic of a bit cell BC of a SRAM constituted by a transistor of a FinFET structure by controlling a size of the transistor of the FinFET structure. In a FinFET structure where its size is discrete from the number of fins, it is difficult to control an optimum ratio of the pull-up current (Ip) to the pull-down current (In) by the allocation number of the silicon fins.

Figure 7A:
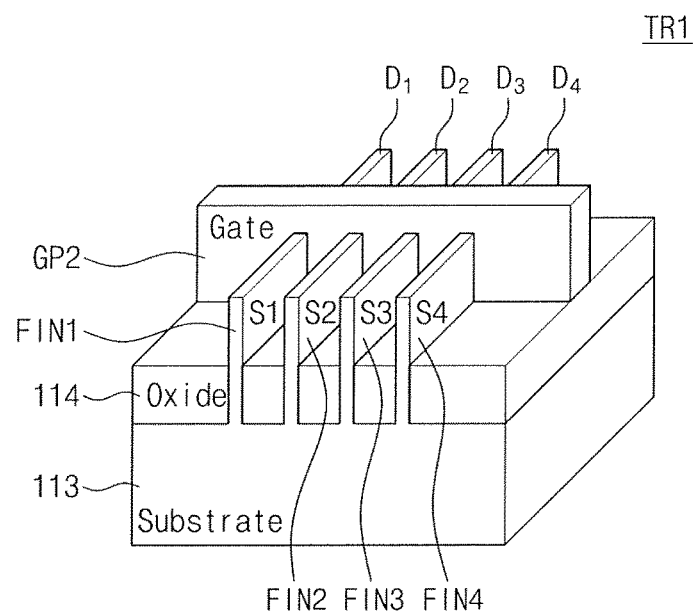
FIGS. 7A and 7B are views illustrating a structure of a FinFET transistors according to a layout of FIG. 6.
Figure 7B:
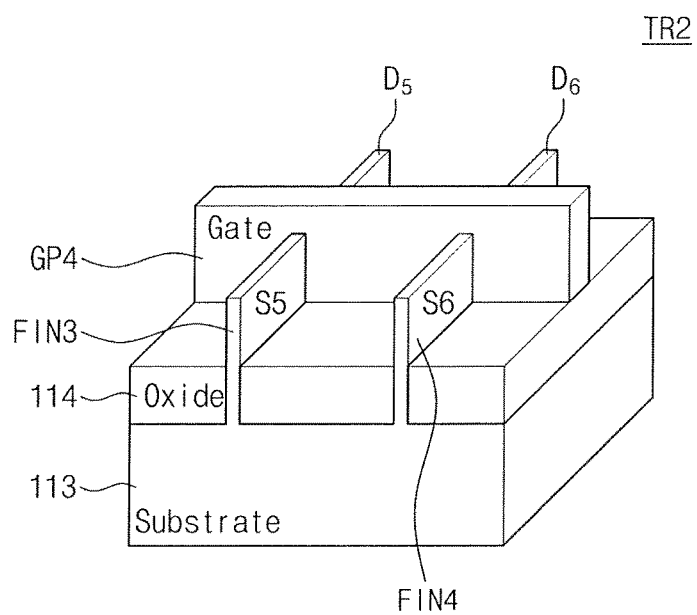

FIGS. 7A and 7B are views illustrating a structure of a FinFET transistors according to a layout of FIG. 6. FIG. 7A is a perspective view illustrating the transistor TR1 having a 4-pin structure, and FIG. 7B is a perspective view illustrating the transistor TR2 having a 2-pin structure.

Referring to FIG. 7A, silicon fins (FIN1, FIN2, FIN3, FIN4) and an oxide layer 114 are formed on an upper portion of a substrate 113. A gate GP2 may be formed on an upper portion of the oxide layer 114 and the silicon fins (FIN1, FIN2, FIN3, FIN4). The silicon fins (FIN1, FIN2, FIN3, FIN4) may constitute sources (S1, S2, S3, S4) and drains (D1, D2, D3, D4). The silicon fins (FIN1, FIN2, FIN3, FIN4) are repeatedly arranged on a top surface of the substrate 113 according to a fixed rule and are isolated from adjacent silicon fins through an isolation device such as a trench STI.

The gate GP2 crosses the silicon fins (FIN1, FIN2, FIN3, FIN4). Parts of the silicon fins (FIN1, FIN2, FIN3, FIN4) located at one side of the gate GP2 function as sources (S1, S2, S3, S4), and the other parts the silicon fins (FIN1, FIN2, FIN3, FIN4) located at the other side of the gate GP2 function as drains (D1, D2, D3, D4). The silicon fins (FIN1, FIN2, FIN3, FIN4) may be formed by etching a predetermined area of the substrate 113. Thus, the silicon fins (FIN1, FIN2, FIN3, FIN4) may have a protruding structure and are defined by both sidewalls and a top surface. An etched area of the substrate 113 is a trench and is filled with an isolation device. According to the transistor TR1 of the FinFET structure, a size of a transistor may be determined by the number of silicon fins.

Referring to FIG. 7B, two silicon fins (FIN3, FIN4) and an oxide layer 114 are formed on a top surface of a substrate 113. A gate GP4 may be formed on an upper portion of the oxide layer 114 and the silicon fins (FIN3, FIN4). The silicon fins (FIN3, FIN4) may constitute sources (S5, S6) and drains (D5, D6). The silicon fins (FIN3, FIN4) are repeatedly arranged on a top surface of the substrate 113 and are isolated from adjacent silicon fins (FIN3, FIN4) through an isolation device such as a trench. According to the transistor TR2 of a FinFET structure, the transistor TR2 has the smaller number of silicon fins than those of the transistor TR1.

Figure 8:
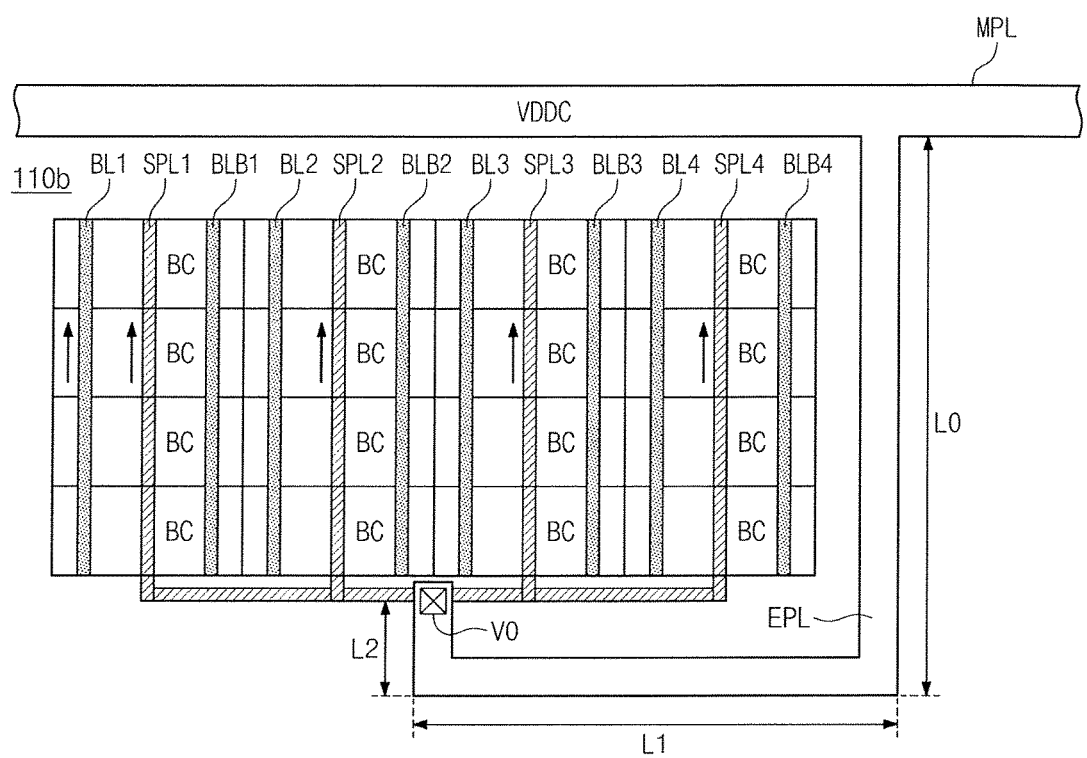
FIG. 8 is a view illustrating a method of forming a power line for providing a cell driving voltage according to an exemplary embodiment of the present inventive concept.

FIG. 8 is a view illustrating a method of forming a sub power line SPL and an extension power line EPL for providing a cell driving voltage VDDC according to an exemplary embodiment of the present inventive concept. Referring to FIG. 8, the extension power line EPL may be formed from a main power line MPL and may branch from the main power line MPL toward a lower side of a cell array 110b for providing a cell driving voltage VDDC or toward the write driver 130.

To provide an electrical connection from the main power line MPL toward a lower portion of the cell array 110b, the extension power line EPL may be formed. The main power line MPL may be located at an upper side of the cell array 110b. The extension power line EPL may be formed to transmit the cell driving voltage VDDC to the sub power lines (SPL1, SPL2, SPL3, SPL4) at a location adjacent to the write driver 130 for driving a bit line BL. The extension power line EPL may include metal lines having lengths (L0, L1, L2) extending from the main power line MPL considering a size of the cell array 110b. For example, the extension power line EPL may include a first part extending from the main power line MPL with a length L0, a second part extending from the first part with a length L1, and a third part extending from the second part with a length L2. The extension power line EPL may use metal lines on different layers to provide the lengths (L0, L1, L2). The extension power line EPL may be connected to the sub power lines (SPL1, SPL2, SPL3, SPL4) formed on the same layer as bit lines (BL1, BLB1, BL2, BLB2 BL3, BLB3 BL4, BLB4) through a via (V0) located at an end of the extension power line EPL. A conductor extending in a direction substantially perpendicular to the sub power lines (SPL1, SPL2, SPL3, SPL4) may be used to connect the extension power line EPL and the sub power lines (SPL1, SPL2, SPL3, SPL4) to each other.

A width or the lengths (L0, L1, L2) of the extension power line EPL may be designed to form a distribution resistance Rc for setting an optimum pull-up current (Ip) corresponding to each of bit cells (BL1, BLB1, BL2, BLB2 BL3, BLB3 BL4, BLB4). In addition, a layout of the semiconductor memory device 100 (e.g., refer to FIG. 1) may be determined such that a via (V0) and distribution resistances of the metal lines that are needed to constitute the extension power line EPL may provide the distribution resistance Rc for providing increased write performance of the bit cells.

Figure 9:
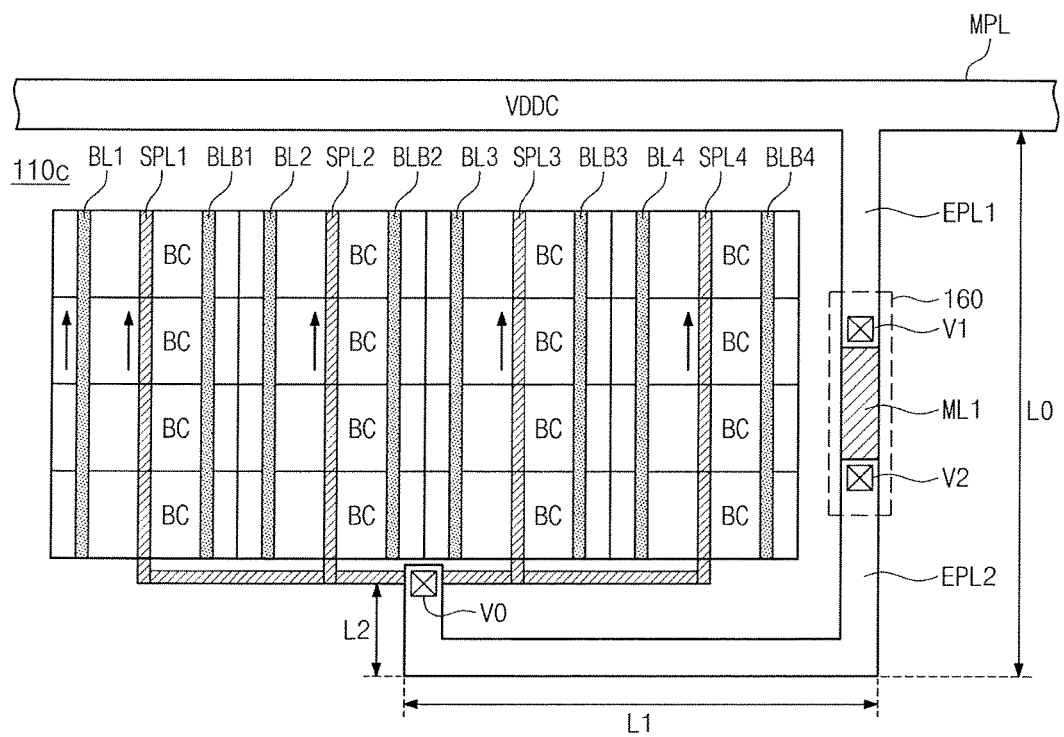
FIG. 9 is a view illustrating a method of forming a power line according to an exemplary embodiment of the present inventive concept.

FIG. 9 is a view illustrating a method of forming a power line according to an exemplary embodiment of the present inventive concept. Referring to FIG. 9, the extension power line EPL may extend from a main power line MPL toward a lower side of a cell array 110c for providing a cell driving voltage VDDC or toward the write driver 130. To provide the optimum distribution resistance value Rc, the extension power line EPL may include metal lines on various layers and vias.

The extension power line EPL extends from the main power line MPL toward a lower side of the cell array 110c. The power line EPL may include metal lines having lengths (L0, L1, L2) from the main power line MPL. To increase the distribution resistance value Rc, an extension line 160 may be inserted into the extension power line EPL. The extension line 160 may include a metal line ML1 on a different layer from that of the extension power line EPL and vias (V1, V2). This will be discussed in more detail later on.

Figure 10:
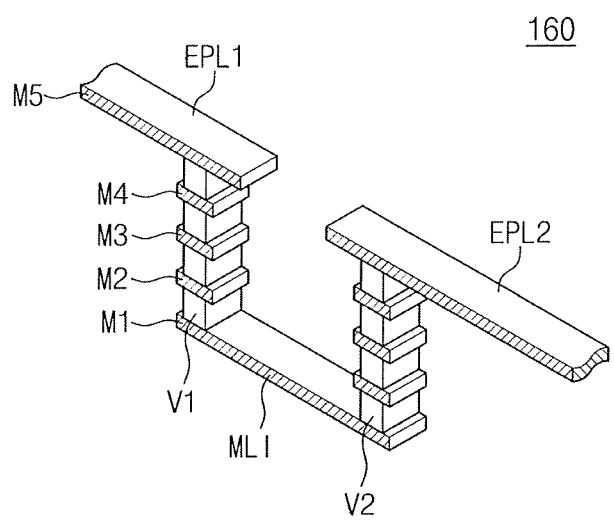
FIG. 10 is a perspective view illustrating an extension line of FIG. 9.

FIG. 10 is a perspective view illustrating the extension line 160 of FIG. 9. Referring to FIG. 10, the extension line 160 includes extension power lines (EPL1, EPL2), the metal line ML1 on a different layer from that of the extension power lines (EPL1, EPL2), and the vias (V1, V2). Here, the vias (V1, V2) extend from the extension power lines (EPL1, EPL2) and penetrate five metal layers (M1, M2, M3, M4, M5). Further, the metal line ML1 is connected to the via V1 and the via V2 on a different layer from that of the extension power lines (EPL1, EPL2). However, the number of metal layers or the number of vias may not be limited to the present embodiment.

The vias (V1, V2) for connecting the extension power lines (EPL1, EPL2) and the metal line ML1 may be designed to have various heights and lengths, respectively, for forming the distribution resistance Rc.

Figure 11:
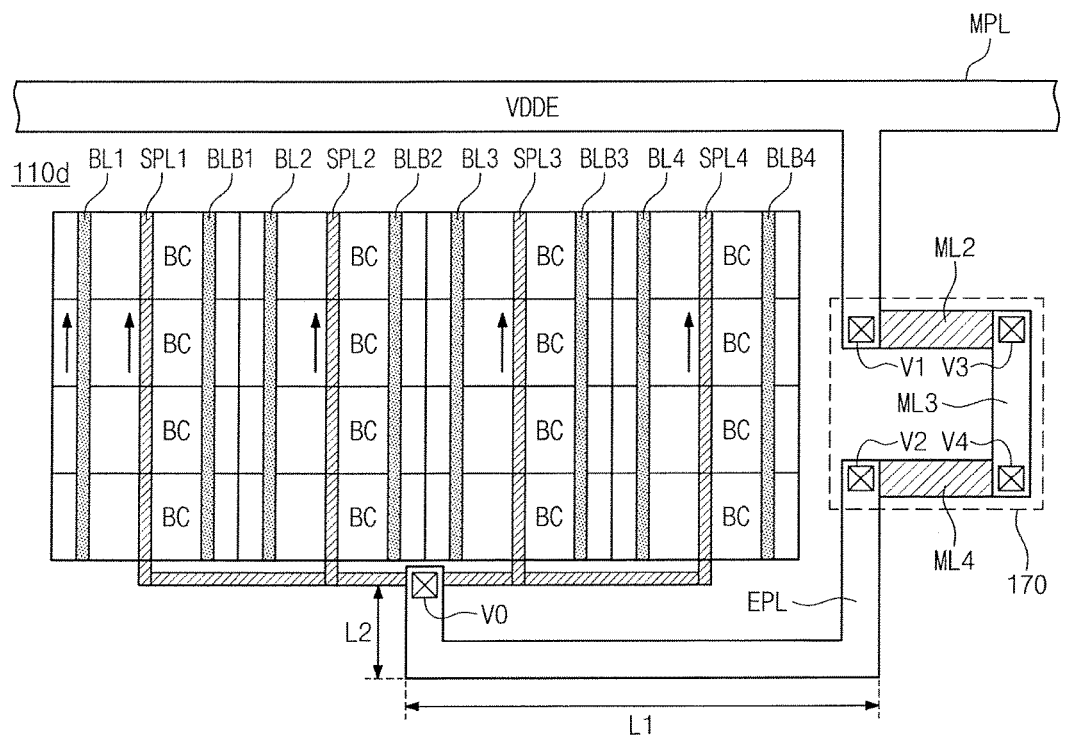
FIG. 11 is a view illustrating a method of forming a power line according to an exemplary embodiment of the present inventive concept.

FIG. 11 is a view illustrating a method of forming a power line according to exemplary embodiments of the present inventive concept. Referring to FIG. 11, the extension power line EPL may extend from a main power line MPL toward a lower side of a cell array 110d for providing a cell driving voltage VDDC or toward the write driver 130. To provide the optimum distribution resistance value Rc, the extension power line EPL may be formed using metal lines on various layers and vias.

The extension power line EPL extends from the main power line MPL toward a lower side of the cell array 110d. The power line EPL may be formed by metal lines having lengths (L0, L1, L2) from the main power line MPL. To increase the distribution resistance value Rc, an extension line 170 may be inserted into the main power line MPL. The extension line 170 may be formed using metal lines (ML2, ML3, ML4) on a semiconductor layer and vias (V1, V2, V3, V4). To provide an additional distribution resistance to the extension power line EPL, various bypass routes using means such as the metal lines (ML2, ML3, ML4) and the vias (V1, V2, V3, V4) may be formed. For example, the metal line ML2 may be connected to the via V0 extending from a part of the extension power line EPL and may be connected to the via V3 extending from the metal line ML3. In addition, the metal line ML4 may be connected to the via V4 extending from the metal line ML3 and may be connected to the via V2 extending from another part of the extension power line EPL.

Figure 12:
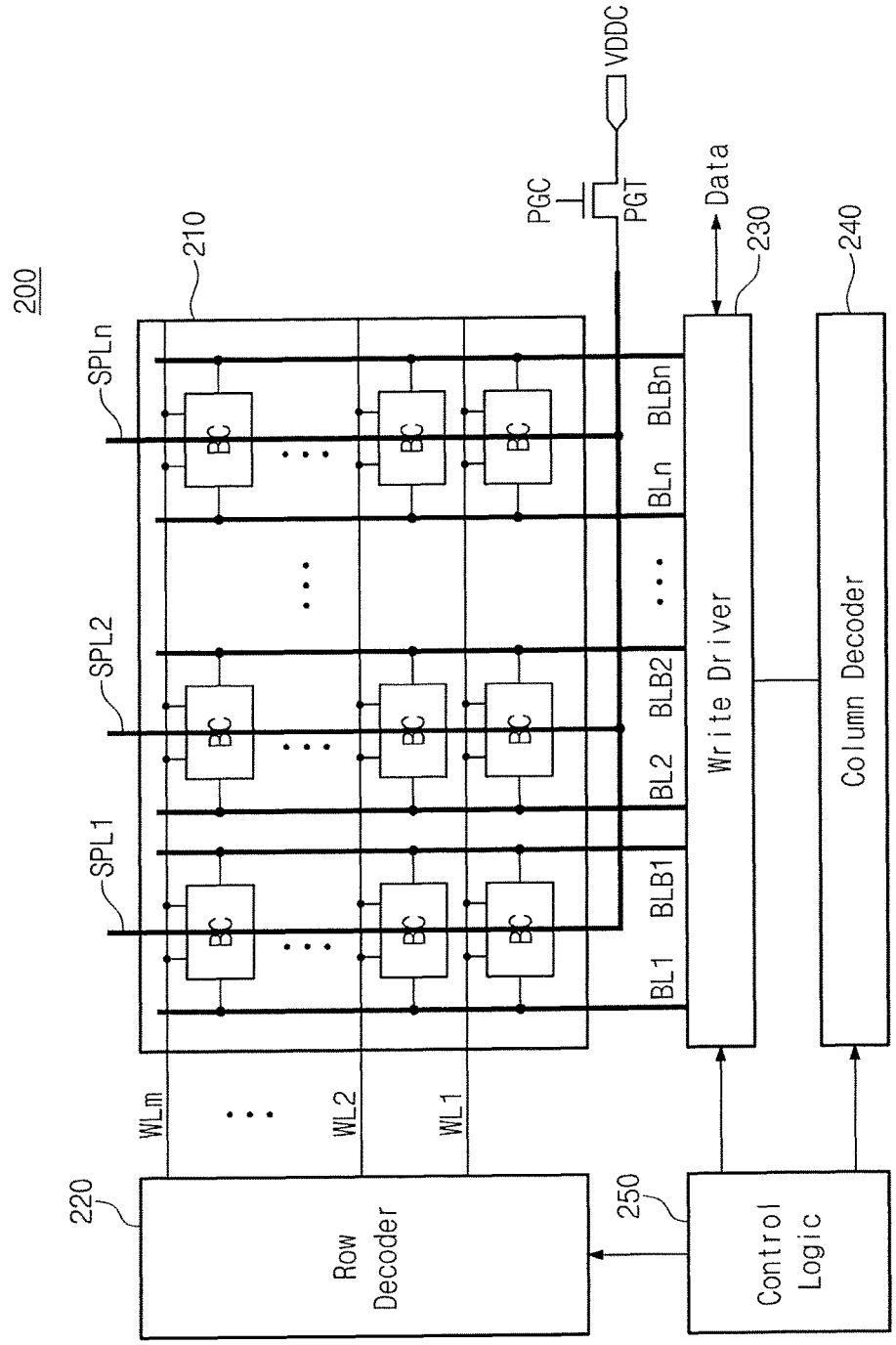
FIG. 12 is a block diagram of a semiconductor memory device according to an exemplary embodiment of the present inventive concept.

FIG. 12 is a block diagram of a semiconductor memory device 200 according to an exemplary embodiment of the present inventive concept. Referring to FIG. 12, the semiconductor memory device 200 may include a cell array 210, a row decoder 220, a write driver 230, a column decoder 240, and control logic 250. Configurations of the cell array 210, the row decoder 220, the write driver 230, the column decoder 240, and the control logic 250 are substantially the same as those of FIG. 1. Thus, a detailed description thereof may be omitted.

Sub power lines SPLi are formed on the same semiconductor layer as bit lines (BLi, BLBi) and may be formed by conductors having the same conductivity, width, and length. A cell driving voltage VDDC for providing a pull-up current (Ip) to bit cells BC is provided to the sub power lines SPLi in a direction where a bit line voltage is supplied from the write driver 230. For example, the cell driving voltage VDDC is supplied to each of the sub power lines SPLi via a power line that extends from an area where the write driver 230 is located.

In addition, a power gate transistor PGT that may selectively cut off a cell driving voltage may be connected to the sub power lines SPLi. The power gate transistor PGT may cut off or supply the cell driving voltage VDDC in response to a power control signal PGC. Power consumed in the bit cells BC that are not used may be reduced by applying the power control signal PGC to selectively cut off and supply the cell driving voltage VDDC.

Figure 13:
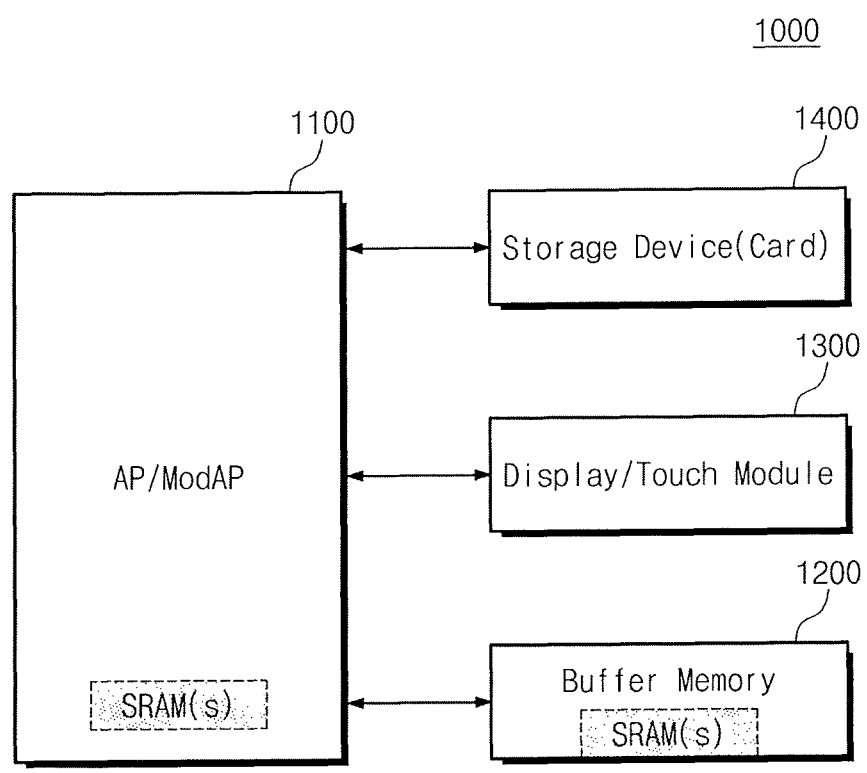
FIG. 13 is a view illustrating a mobile device using a SRAM according to an exemplary embodiment of the present inventive concept.

FIG. 13 is a view illustrating a mobile device 1000 using a SRAM according to an exemplary embodiment of the present inventive concept. Referring to FIG. 12, the mobile device 1000 may include a processor (AP/ModAP) 1100, a buffer memory 1200, a display/touch module 1300, and a storage device 1400.

The mobile device 1000 may further include a security chip. The security chip may be embodied to provide an overall security function. The security chip may be constituted with software and/or tamper resistant hardware, may allow a high level of security, and may work in cooperation with TEE (tamper resistant hardware) of the processor 1100. The security chip may include a native operating system, a security storage device which is an internal data storing place, an access control block controlling an access right to the security chip, an ownership management, a key management, a digital signature, a security functional block performing code/decode, and a firmware update block for updating firmware of the security chip. The security chip may be, for example, UICC (universal integrated circuit card, e.g., USIM, CSIM, ISIM), a SIM (subscriber identity module) card, an eSE (embedded secure elements), MicroSD, Stickers, etc.

The processor 1100 may be embodied to control an overall operation of the mobile device 1000 and a wired/wireless communication with the outside. For example, the processor 1100 may be an application processor (AP), a combined modem application processor (ModAP). The processor 1100 may include the SRAM described in FIGS. 1 through 12.

The buffer memory 1200 may be embodied to temporarily store data for an operation of processing for the mobile device 1000. The buffer memory 1200 may include the SRAM described in FIGS. 1 through 12.

The display/touch module 1300 may be embodied to display data processed in the processor 1100 or to receive data from a touch panel. The storage device 1400 may be embodied to store user data. The storage device 1400 may be an eMMC (embedded multimedia card), a SSD (solid state drive), a UFS (universal flash storage), etc. The storage device 1400 may include at least one nonvolatile memory device.

The mobile device 1000 may increase overall performance by increasing write performance and maintaining read performance regardless of a low power supply voltage.

In a SRAM device according to an exemplary embodiment of the present inventive concept, a bit line and a cell power line are constituted by conductive lines formed on the same layer as each other and in the same direction, and thereby, a deviation of write performance of SRAM cells in a cell array may be minimized.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A static random access memory device comprising:
a plurality of memory cells arranged in rows and columns;
a write driver configured to apply a bit line voltage corresponding to write data to a bit line extending in a column direction of the plurality of memory cells in a write operation; and
a sub power line configured to transmit a cell driving voltage to the plurality of memory cells in the write operation and to extend in a direction parallel to the bit line, and includes a first node and a second node,
wherein the cell driving voltage is applied to the first node of the sub power line and the first node of the sub power line is aligned with an output node of the write driver in a row direction of the plurality of memory cells.

2. The static random access memory device of claim 1, wherein the sub power line includes a metal line on a same semiconductor layer as the bit line.

3. The static random access memory device of claim 2, wherein the sub power line has the same width and the same length as the bit line.

4. The static random access memory device of claim 1, further comprising an extension power line connected to the first node of the sub power line, wherein the extension power line extends from a main power line.

5. The static random access device of claim 4, wherein the extension power line comprises an extension conductor for providing a distribution resistance of a specific resistance value between the main power line and the first node.

6. The static random access memory device of claim 5, wherein the extension conductor comprises at least one metal line located on a metal layer different from the extension power line and at least one via for connecting the at least one metal line to the extension power line.

7. The static random access memory device of claim 5, wherein the specific resistance value is determined as a value for adjusting a size of a pull-up current and a pull-down current of each of the plurality of memory cells.

8. The static random access memory device of claim 4, wherein the extension power line comprises a power gating transistor for cutting off supply of the cell driving voltage in response to a power gating control signal.

9. The static random access memory device of claim 1, wherein each of the plurality of memory cells comprises a FinFET-type transistor.

10. A static random access memory device comprising:
a cell array comprising a plurality of bit cells;
a plurality of bit lines extending in a column direction;
a plurality of sub power lines extending in a direction parallel to the bit lines;
a write driver writing data in a selected bit cell through the plurality of bit lines;
a main power line providing a cell driving voltage to the selected bit cell; and
an extension power line connecting the main power line and the sub power line,
wherein each of the plurality of sub power lines is formed with a conducive line on the same semiconductor layer as the plurality of bit lines, and
wherein the extension power line, in a write operation, is formed to have a length having a distribution resistance for providing a ratio of a pull-up current to a pull-down current of the selected bit cell as a predetermined value.

11. The static random access memory device of claim 10, wherein each of the plurality of sub power lines has the same width and length as the plurality of bit lines.

12. The static random access memory device of claim 10, wherein one end of the extension power line that is connected to the plurality of sub power lines is adjacent to the write driver.

13. The static random access memory device of claim 10, wherein the extension power line comprises a bypass route including metal lines on a plurality of semiconductor layers and provides the distribution resistance.

14. The static random access memory device of claim 13, wherein the extension power line comprises a plurality of vias for connecting the metal lines on the plurality of semiconductor layers to the extension power line.

15. The static random access memory device of claim 10, further comprising at least one power gating transistor for supplying the cell driving voltage in response to a power control signal.

16. A static random access memory device comprising:
a plurality of memory cells arranged in rows and columns;
a write driver configured to apply a bit line voltage to an end of a bit line in a column direction of the plurality of memory cells;
a sub power line configured to transmit a cell driving voltage to the plurality of memory cells in a direction parallel to the bit line, wherein the sub power line has the same length and width as the bit line;
a first extension power line connected to an extension conductive line; and
a second extension power line connected to the extension conductive line and the sub power line.

17. The static random access memory device of claim 16, wherein the extension conductive line includes a metal line connected to the first extension power line through a first via and to the second extension power line through a second via.

18. The static random access memory device of claim 17, wherein the first extension power line is connected to a main power line.

19. The static random access memory device of claim 17, wherein the first via and the second via penetrate a plurality of metal layers.

20. The static random access memory device of claim 16, wherein the cell driving voltage is applied to an end of the sub power line, and the end of the sub power line and the end of the bit line are aligned with each other in a row direction.

* * * * *